Oct. 4, 1966 KAZUMICHI MIYAZAWA 3,277,386

OVERLOAD PROTECTION CIRCUIT FOR TRANSISTOR AMPLIFIERS

Filed Oct. 21, 1963

Kazumichi Miyazawa,
INVENTOR.

BY Wenderoth, Lind and Ponack, Attorneys 3,277,386
Patented Oct. 4, 1966

3,277,386

OVERLOAD PROTECTION CIRCUIT FOR TRANSISTOR AMPLIFIERS

Kazumichi Miyazawa, Kawasakishi, Japan, assignor to Torio Company, Limited, Tokyo, Japan, a limited-liability company of Japan Filed Oct. 21, 1963, Ser. No. 317,640
2 Claims. (Cl. 330—22)

This invention relates to an overload protection circuit for transistor amplifiers.

The chief object of the invention is to suspend the amplifying action of the first stage transistor of a transistor amplifier when an overload flows in the load or output circuit of said amplifier.

Another object thereof is to prevent leakage of the input signal from the base to the collector of said first stage transistor.

A further object is to suspend the amplifying action of said first stage transistor when the temperature of a room, in which said transistor amplifier is installed, rises abnormally.

Further objects and advantages will become apparent from a consideration of the following description.

In the accompanying drawing.

Like reference characters show corresponding parts throughout the views.

Figure 1:
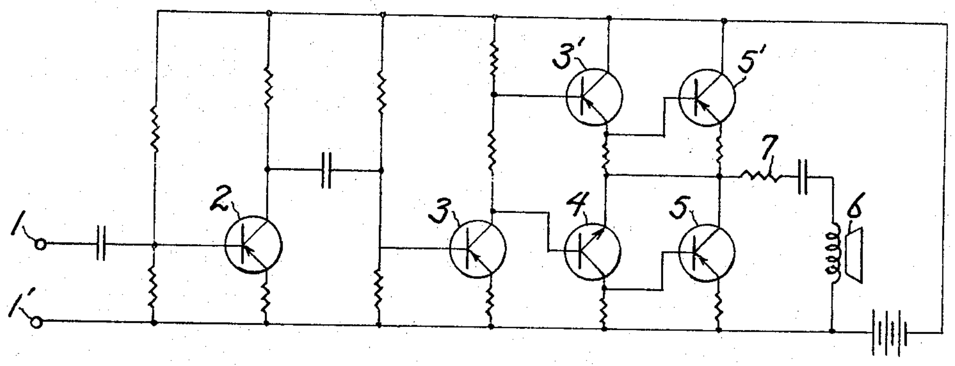
FIG. 1 is a circuit diagram of a transistor amplifier.

In an OTL (output transformer-less) transistor amplifier as shown in FIG. 1, a signal supplied to the input terminals 1 and 1' is successively amplified by the first stage transistor 2, interstage transistors 3 and 3', a phase inverting transistor 4 and the output transistors 5 and 5', and then supplied to a load, for example a loud speaker 6.

If an overload current flows in the load circuit due to a short circuit of said load or an overly great magnitude of the input signal, said output transistors will be damaged. In order to avoid said damage a protective resistor 7 is usually inserted in the load circuit, thereby limiting the overload current. However, in this case active current flows through said resistor all the time, producing a power loss, and further, if a sufficient output to overcome the resistance of said resistor is added to the loud speaker 6, there will be produced sound distortion.

Figure 2:
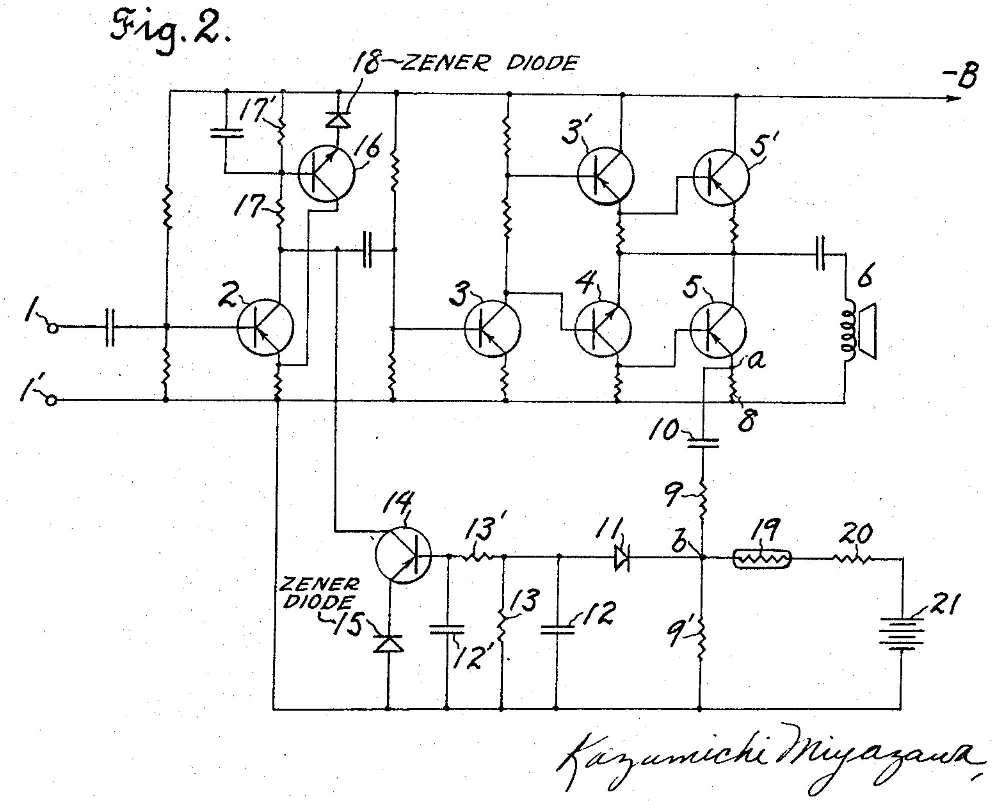
FIG. 2 is a circuit diagram of a overload protection apparatus according to the invention applied to said transistor amplifier.

In the protection circuit according to the invention applied to said transistor amplifier as shown in FIG. 2, the protective resistor is removed, and the connection point *a* between the emitter of the output transistor 5 and its emitter resistor 8 is connected to voltage dividing resistors 9 and 9' through a blocking condenser 10, whereby negative pulsating voltage is derived from the resistor 8 at the resistor 9'. Said negative pulsating voltage is rectified by a rectifier 11 and filtered by a filter condenser 12, voltage dividing resistors 13 and 13' and a filter condenser 12, and then added to the base of a protective transistor 14 as the bias voltage therefor for amplifying the obtained direct current.

Inserted in the emitter circuit of said transistor is a non-linear rectifier 15 such as a Zener diode, and the collector of said transistor is connected to the collector of the first stage transistor 2.

Now, when an overload current flows in the circuit of the load 6, a part of the negative pulsating voltage which is produced at the resistor 8 in response to the input signal is derived from the point *a* at the resistor 9'.

Said negative pulsating voltage due to the overcurrent is rectified by the rectifier 11 and added to the base of the protective transistor 14, lowering its bias. When said bias is lowered to some extent, the non-linear rectifier 15 breaks down, whereby the voltage in the emitter and collector circuit of said transistor rapidly increases, raising the voltage of the collector of the first stage transistor 2, thus suspending the amplifying action thereof, and accordingly, current flow in the load circuit of the transistor amplifier is greatly reduced and the output transistors 5 and 5' are protected from damage.

However, by means of a slight amplifying action between the base and the collector of the first stage transistor 2, a small part of the input signal supplied to said base leaks to said collector. To prevent this leakage another protective transistor 16 the polarity of which is opposite to the first stage transistor is installed. The collector of the transistor 16 is connected to the emitter of the transistor 2, and the base connected to the connection point of voltage dividing resistors 17 and 17' which are inserted between the collector of the transistor 2 and —B line, and further, the emitter of the transistor 16 is connected to the —B line through a non-linear rectifier 18 such as a Zener diode.

As above stated, when an overload current flows in the load circuit of the transistor amplifier and the collector voltage of the first stage transistor 2 is raised, then the bias voltage on the base of the protective transistor 16 is raised. By said raising to some extent the emitter and collector current of said transistor rapidly increases, raising the emitter voltage of the first stage transistor 2, thus preventing said leakage of the output signal to the collector of said transistor.

Furthermore, connected in parallel to the resistor 9' are a thermistor 19, a protective resistor 20 and a battery 21. When the temperature of a room, in which the transistor amplifier is installed, rises abnormally, the resistance of the thermistor 19 decreases, increasing the current in the thermistor circuit, and the voltage at the connection point *b* of the voltage dividing resistors 9 and 9' is raised, thereby lowering the bias on the base of the protective transistor 14 and suspending the amplifying action of the first stage transistor 2 as before described, thus protecting the transistor amplifier from overheating due to a rise in the room temperature.

In said embodiment of the invention the negative pulsating voltage is derived from the emitter resistor 8 of the output transistor 5, but positive pulsating voltage may be derived from the collector resistor of the output transistor 5' to attain the same objects.

What I claim is:

1. A multistage transistor amplifier having an overload protective circuit, comprising a plurality of coupled amplifier stages, a resistor coupled to the output side of the last amplifier stage and deriving a pulsating voltage from said last amplifier stage which is responsive to the input signal to said amplifier, a first protective transistor having said resistor coupled to the base thereof, a rectifier connected between said base and said resistor, the collector of said first protective transistor being coupled to the collector of the first stage transistor of said amplifier, a first non-linear rectifier coupled between the emitter of said first protective transistor and the emitter of said first stage transistor, a second protective transistor having a polarity opposite that of the first stage transistor and having the collector thereof coupled to the emitter of said first stage transistor, a pair of series connected voltage dividing resistors coupled between the collector of the first stage transistor and the —B line of said amplifier and the base of said second protective transistor being connected to the connection between said voltage dividing resistors, and a second non-linear rectifier coupled between the emitter of said second protective transistor and the —B line of said amplifier.

2. A multistage transistor amplifier as claimed in claim 1 further comprising a thermistor and a source of D.C. current, said thermistor being connected in series between said source of current and said pulsating voltage deriving resistor.

References Cited by the Examiner

UNITED STATES PATENTS

| | | | |
|---|---|---|---|
| 2,858,424 | 10/1958 | Stern et al. | 330—29 XR |
| 2,949,579 | 8/1960 | Wu | 330—29 XR |
| 3,102,241 | 8/1963 | Johnstone | 330—29 XR |
| 3,188,575 | 6/1965 | Sheffet | 330—29 XR |
| 3,200,346 | 8/1965 | Young | 330—100 XR |

ROY LAKE, *Primary Examiner.*

F. D. PARIS, *Assistant Examiner.*